United States Patent [19]
Lowe et al.

[11] 3,968,499
[45] July 6, 1976

[54] APPARATUS FOR PRODUCING CONTINUOUS GRAPHIC DISPLAYS FROM INTERMITTANTLY SAMPLED DATA

[75] Inventors: Peter R. Lowe, Englewood; Tommy N. Tyler, Broomfield, both of Colo.

[73] Assignee: Honeywell Inc., Minneapolis, Minn.

[22] Filed: Feb. 19, 1975

[21] Appl. No.: 550,984

[52] U.S. Cl. .................. 346/110 R; 340/15.5 A; 340/15.5 AP; 340/324 A
[51] Int. Cl.² .......................................... G01D 9/42
[58] Field of Search ................ 346/108, 110 R; 340/324 A, 324 AD, 15.5 A, 15.5 AP, 15.5 AC, 324 R

[56] References Cited
UNITED STATES PATENTS

| | | | |
|---|---|---|---|
| 2,811,665 | 10/1957 | McNaney | 346/110 R X |
| 3,006,713 | 10/1961 | Klein, Jr. et al. | 346/108 |
| 3,040,320 | 6/1962 | Ikard | 346/108 X |
| 3,383,701 | 5/1968 | Smith et al. | 346/108 |
| 3,605,109 | 9/1971 | Tyler et al. | 346/110 R |
| 3,648,270 | 3/1972 | Metz et al. | 340/324 AD |
| 3,714,663 | 1/1973 | Smith | 346/110 R X |
| 3,715,762 | 2/1973 | Magill et al. | 340/324 R X |

*Primary Examiner*—L. T. Hix
*Assistant Examiner*—Stanley J. Witkowski
*Attorney, Agent, or Firm*—Laurence J. Marhoefer; Lockwood D. Burton; George E. Bodenstein

[57] ABSTRACT

The minimum and maximum values attained by an analog data signal in each of successive sampling periods are determined by alternately operative amplitude detectors which produce and store a corresponding minimum and maximum signal for each of these periods. A generator produces a ramp signal which repeats in each period in synchronism with the sweep of the beam of a fiber optics strip cathode ray tube along the strip thereof. A record sheet is advanced at right angles to this strip. Comparators are operative in each period to compare the stored detector signals of the immediately preceding period with the ramp signal, and to produce an output when the ramp signal exceeds either of the detector signals. An EXCLUSIVE OR gate receives these outputs and unblanks the normally blanked tube beam for a time in each period to produce a line on the sheet extending along the strip between points representing the minimum and maximum signal values for the preceding period. The successive lines of the successive periods combine to form a recorded curve for the data signal.

14 Claims, 6 Drawing Figures

FIG. I
PRIOR ART

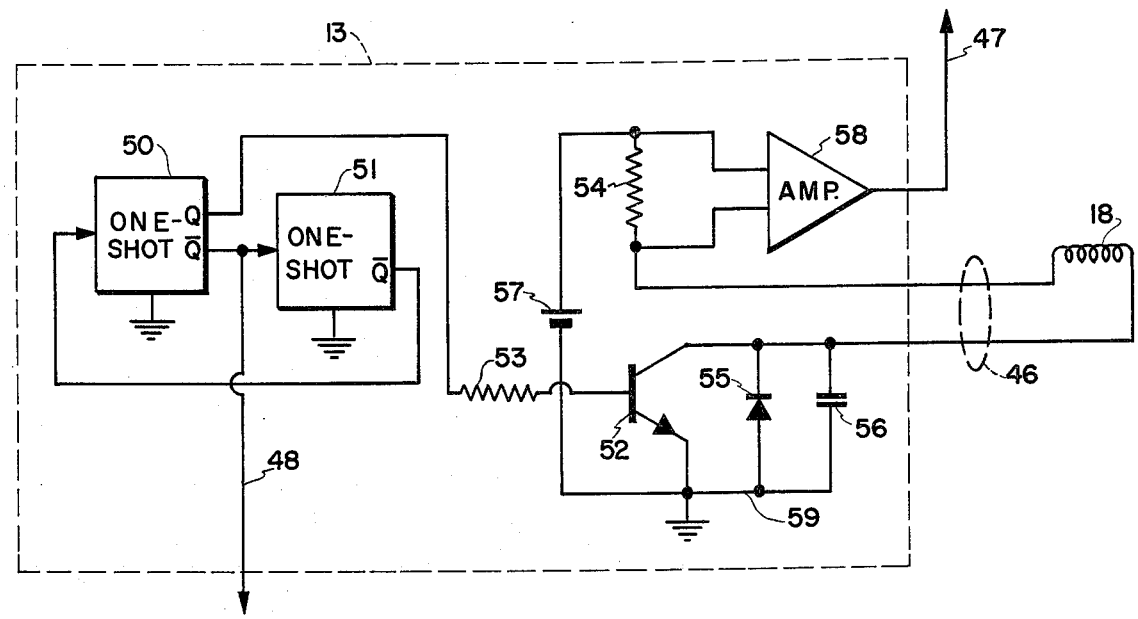
F I G. 4
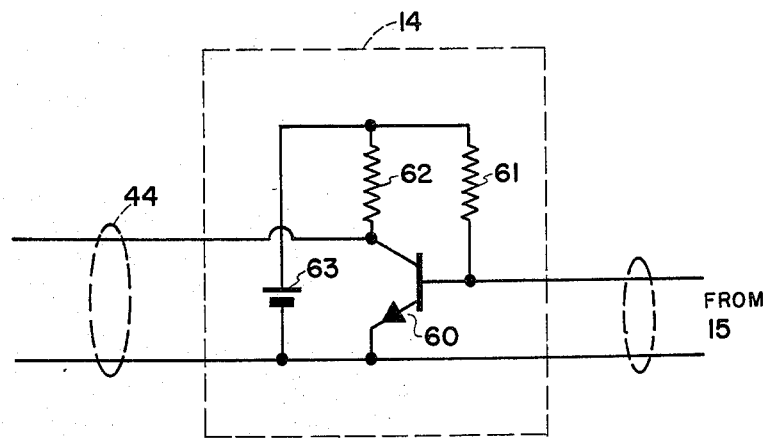
F I G. 5

APPARATUS FOR PRODUCING CONTINUOUS GRAPHIC DISPLAYS FROM INTERMITTANTLY SAMPLED DATA

BACKGROUND OF THE INVENTION

1. Field of the Invention

This invention relates generally to the production of graphic displays of analog data signals, and relates particularly to such displays that are produced on the basis of intermittently obtained values or samples which represent successive amplitude conditions or values of the signals.

2. Description of the Prior Art

Graphic display apparatus for producing single or multi-channel analog indications and/or records of the amplitude variations of sampled data signals are known in the art. One such known form of apparatus has an undesirable characteristic, however, of producing or plotting each of the curves as a series of separated elements or dots instead of as a substantially continuous line or trace. As a result, the curves produced by such apparatus and the indications and/or records, are often difficult, if not impossible, to interpret and analyze. This is particularly true in the case of a plurality of superimposed or overlapping curves representing data signals having relatively high frequencies and/or irregular wave forms.

In another form of known prior art apparatus, single or multi-channel graphic displays are produced from intermittently sampled data by a so-called connected sampling method that yields substantially continuous, and hence more discernible, curves, notwithstanding the intermittent nature of the sampled data from which the curves are produced. In this form of apparatus, the curves representing the analog signals are obtained by producing successive substantially parallel lines on a display medium, each of the lines being substantially continuous and extending between two points, the positions of which represent, respectively, a corresponding two, consecutively derived ones of the sampled data values. Specifically, each parallel line comprises a line segment connecting the previous and the present values of the data signal. An example of a method and apparatus for producing such a connected sampling graphic display from intermittently sampled data is shown in U.S. Pat. No. 3,605,109. With this prior art method and apparatus, as long as the analog signal or signals are slewing in one direction or the other, there is little or no error in the graphic representation of the signal or signals. If the signal should undergo a very rapid or abrupt change of direction between two sample periods, however, significant peak errors can occur, in that such peaks will not be indicated or recorded. Thus, while graphic display apparatus of this type is extensively used in many applications, such apparatus is not suitable for use where it is desired to indicate and/or record abruptly changing or transient data.

SUMMARY OF THE INVENTION

Accordingly, it is an object of the present invention to provide an improved apparatus for producing a graphic display from intermittently sampled data, which apparatus yields substantially continuous, clearly discernible indicated and/or recorded curves that comprise a more faithful reproduction of the data than has hitherto been attainable, notwithstanding the intermittent nature of the sampled data used as the information from which the curves are produced.

In accomplishing these and other objects, the apparatus of the present invention departs from the techniques employed in the prior art apparatus by producing each displayed line segment from the minimum to the maximum excursion of the data or input signal during a previous sampling period, rather than having each displayed line segment connect the previous and present values of the input signal.

In one form of apparatus according to the present invention, the foregoing operation is accomplished by the use of a pair of amplitude-detector type circuits or channels which are arranged to store the minimum and maximum excursion of an input analog signal, to supply their respective outputs to comparator circuits without appreciable degradation, and to be reset to zero upon command. These circuits are operative in complementary manner, during successive alternate periods, to store the minimum and maximum values of the data signal and to present the stored values to the comparators for unblanking a cathode ray tube display device. Each such period corresponds to the duration of a sweep of the cathode ray tube beam. By so alternating between the amplitude-detector circuits, the minimum and maximum values of the data signal during each sweep and retrace period are always detected and stored by one or the other of the detectors, whereby transient peak and valley information contained in the data signal will always be displayed, and the loss of data minimized.

BRIEF DESCRIPTION OF THE DRAWINGS

A better understanding of the present invention may be had from the following detailed description when read in connection with the accompanying drawings wherein:

FIG. 4 is a diagram of a device which is useful as the generator of the FIG. 3 apparatus;

FIG. 5 is a diagram of a device which is useful as the unblanking amplifier of the FIG. 3 apparatus.

DESCRIPTION OF THE PREFERRED EMBODIMENT

Figure 1:
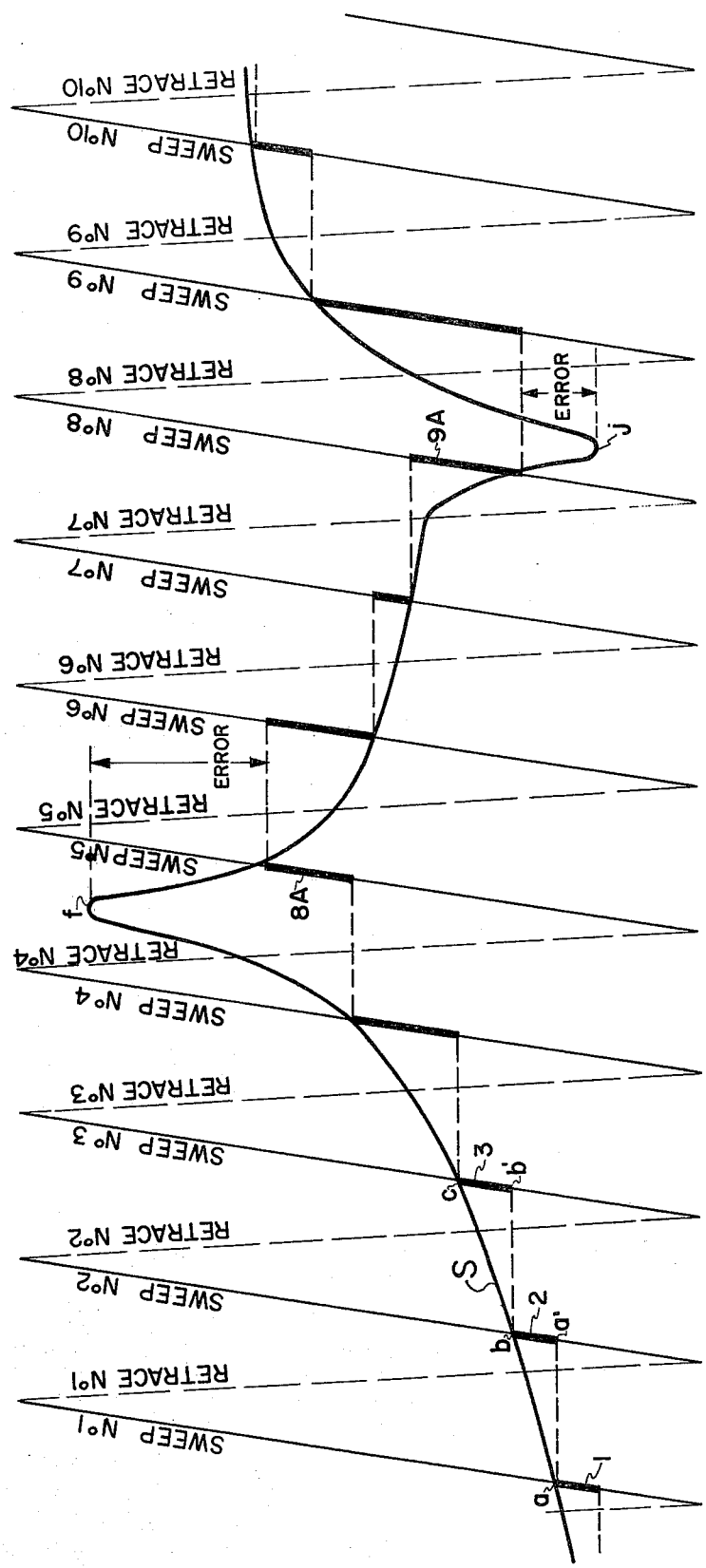
FIG. 1 is a representation which illustrates the nature of the curves produced by the type of prior art apparatus described above.
Figure 2:
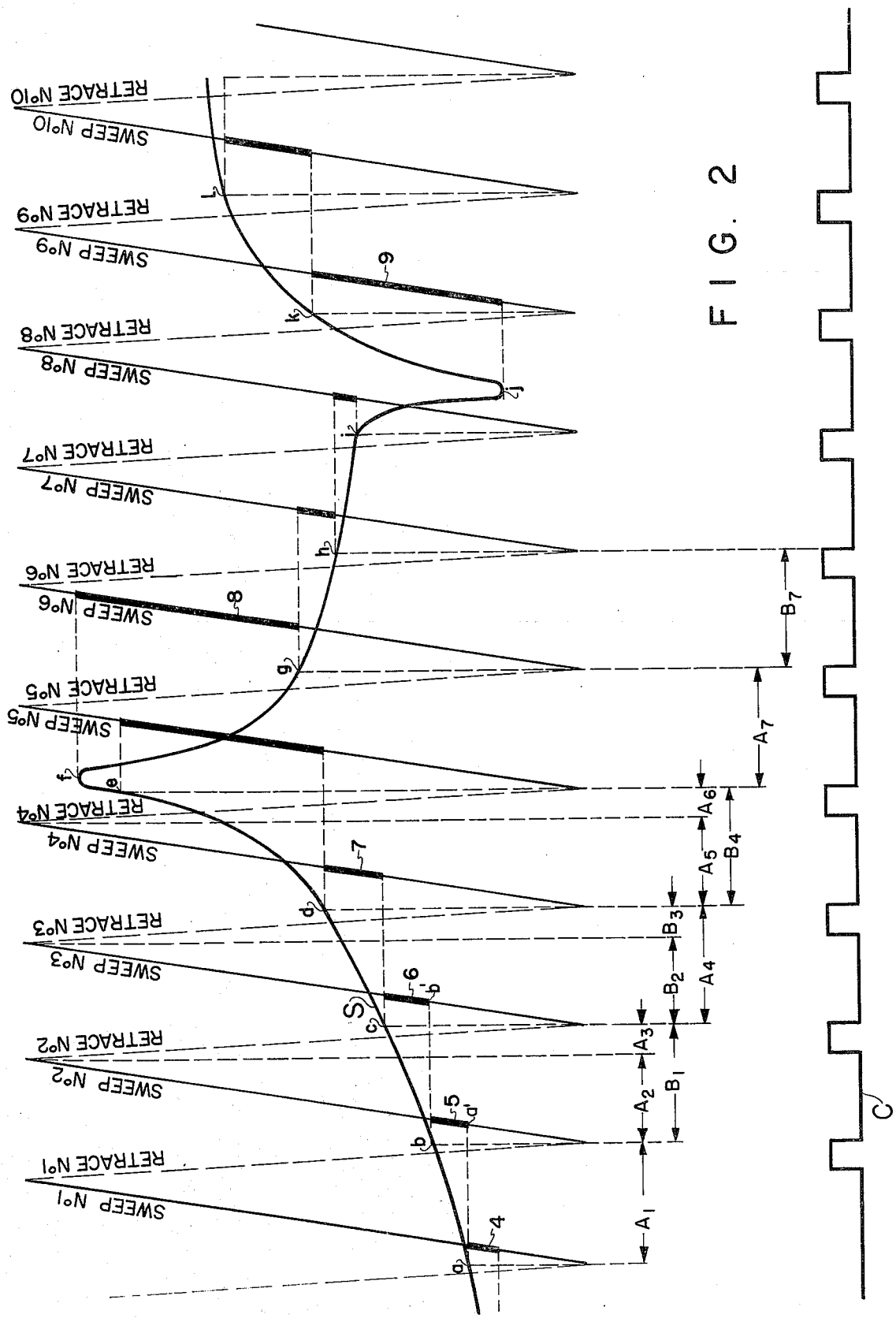
FIG. 2 is a representation which illustrates the nature of the curves produced according to the method and apparatus of the present invention.

The Curves of FIGS. 1 and 2

FIG. 1 shows a recording of an analog signal obtained by the use of the above-described prior art connected-sampling recording technique. A more detailed description of this prior art technique will now be provided as an aid to the understanding of the preferred embodiment of the present invention.

In FIG. 1, the series of light solid lines identified as Sweep No. 1, Sweep No. 2, etc., represent successive scan or sweep paths for a cathode ray tube beam across a photosensitive record sheet, assuming the sheet to be moving to the left across the face of the cathode ray tube and time to be therefore increasing toward the right. The dash lines between the sweep paths, identified as Retrace No. 1, Retrace No. 2, etc., represent the retrace, return, or flyback paths of the beam. For purposes of illustration, the lines have been shown with exaggerated spacing along the time axis, as would occur if the record sheet were being moved at an abnormally high rate of speed past the face of the cathode ray tube.

The heavy line indicated by the letter S in FIG. 1 represents the actual value of the data signal under measurement with respect to time. During a given sweep or scan, such as Sweep No. 1, it is seen that as the value of a ramp signal, which follows a sweep signal that has been employed to produce the sweep, rises from its lowest value, it eventually reaches a point of coincidence with the value of the data signal S. This point is the point $a$, as seen in FIG. 1. For convenience, this point is referred to as the present value of the data signal for Sweep No. 1. Similarly, the point $b$ represents the present value of the data signal for the immediately succeeding Sweep No. 2, the point $c$ represents the present value in the next Sweep No. 3, etc.

During each sweep of the ramp signal in the prior art apparatus, a comparator detects the occurrence of the foregoing coincidence between the ramp and data signal values, and produces an output signal upon each such occurrence. For example, the comparator output signal will appear during Sweep No. 1 when the ramp signal reaches the present value represented by the point $a$. The comparator maintains each such output signal until the time that the ramp signal value drops below the data signal value during the following retrace or flyback period. Thus, for each sweep, the comparator produces an output signal at the time that the ramp signal reaches the present value of the data signal, and terminates this output signal when the ramp signal drops below the data signal.

By further reference to FIG. 1, it is seen that, during each sweep, the ramp signal also passes through a value coinciding with the present value of the data signal in the immediately preceding or previous sweep. For any given sweep, this value will, for convenience, be referred to as the previous value of the data signal. For Sweep No. 2, for example, the point $a'$ represents the previous value of the data signal, whereas for Sweep No. 3, the point $b'$ represents the previous value of the data signal, etc.

In the operation of the prior art apparatus, the cathode ray tube is normally blanked, and is unblanked in each sweep, to mark the sheet, only during the time that the ramp signal value lies between the present and previous values of the data signal for that sweep. Thus, in each sweep, the tube is unblanked by the arrival of the ramp signal at the previous or present value that occurs first or earliest in that sweep, and is blanked again by the arrival of the ramp signal at the other of the previous and present values. As a result, for each sweep, the beam of the tube marks the sheet to produce a line segment extending between two points, the positions of which represent, respectively, the previous and the present values of the data signal for that sweep. Thus, each successive line segment 1, 2, 3, etc., which together make up the graphic display or recorded curve for the data signal S, is drawn between two points, the positions of which represent, respectively, the presently sampled and immediately previously sampled values of the data signal. The prior art apparatus accomplishes this by remembering in each sweep the point in time in the immediately previous sweep at which the ramp signal corresponded to the data signal, and by turning the beam on or off, as the case may be, at the same point in time in the current sweep.

It will be seen by reference to FIG. 1 that, as long as the data signal is slewing in one direction or the other, there is little or no error in this recording technique. Should the data signal undergo an abrupt change of direction between two sample periods, however, as is illustrated in Sweep No. 5 and Sweep No. 8, significant error can occur, in that there is no indication or recording of the peak or valley, and this information is lost.

FIG. 2 shows the same analog data signal curve S as is illustrated in FIG. 1, but shows the indicated or recorded curve which would be produced for this data signal in accordance with the method and apparatus of the present invention. A preferred form of such apparatus, which will be assumed to have produced the recorded curve of FIG. 2, is illustrated in FIG. 3, and the FIG. 2 disclosure will thus be described in detail hereinafter in conjunction with the description of the operation of the FIG. 3 apparatus.

Figure 3:
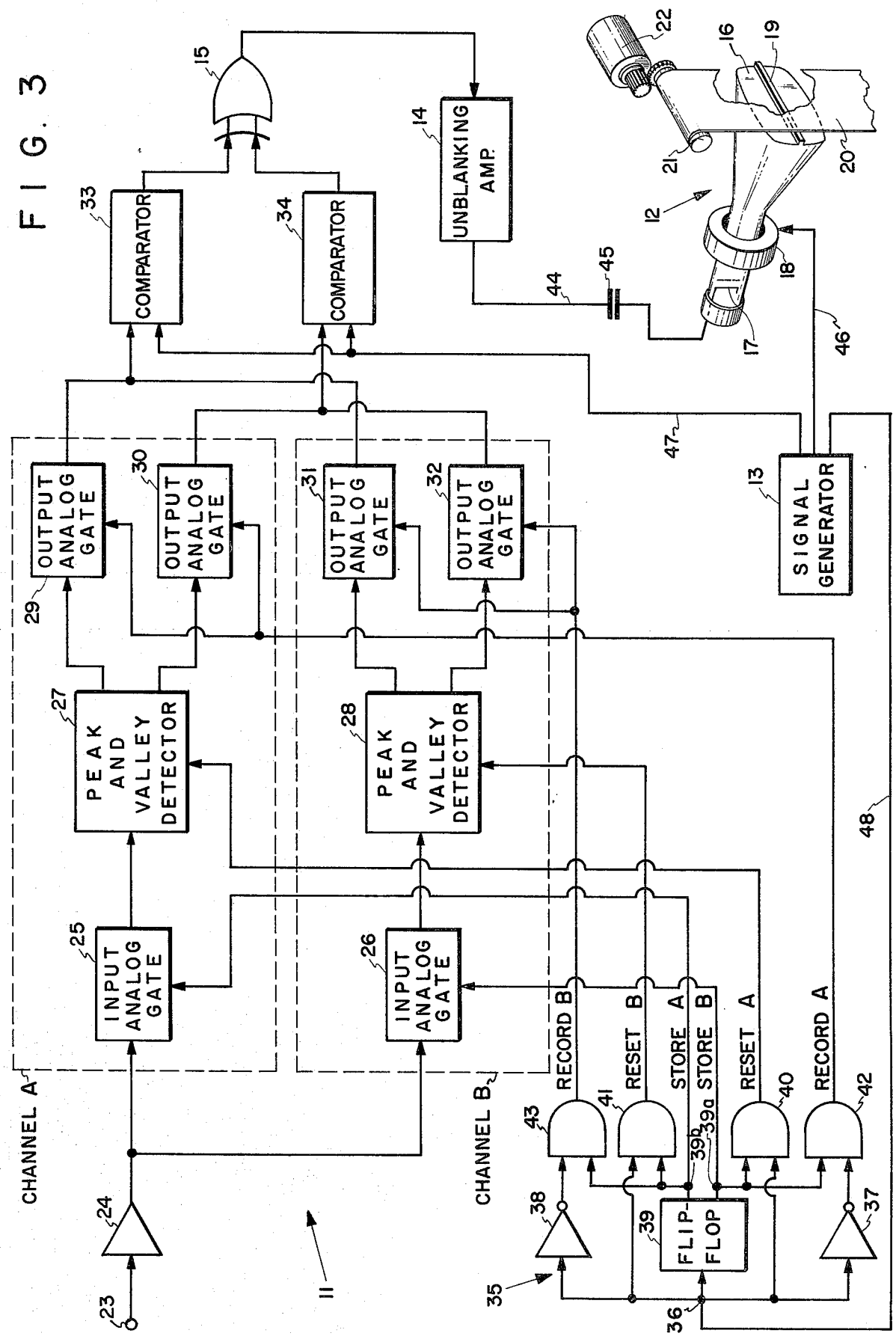
FIG. 3 is a diagram of a single channel display-producing apparatus according to the present invention employing the novel method thereof.

The FIG. 3 Apparatus

The apparatus of FIG. 3 includes a data signal input channel or circuit portion indicated at 11, a fiber optics cathode ray tube indicated at 12, a signal generator indicated at 13 having a ramp signal output, a deflection or sweep signal output, and a square wave clock pulse signal output, an unblanking amplifier 14, and an EXCLUSIVE OR gate 15. The cathode ray tube 12 is of the known fiber optics type having a faceplate 16 and a gun including a cathode 17 with which the cathode ray beam of the tube 12 is controlled. The beam of the tube 12 is controlled by the unblanking amplifier 14 and the EXCLUSIVE OR gate 15. To that end, the output terminal of the latter is connected to the input terminal of the amplifier 14. The output terminal of the amplifier 14 is connected by a connection 44 and a capacitor 45 to the cathode 17 of the tube 12. A horizontal deflection coil 18 is associated with the tube 12 in the usual manner, and is connected to the generator 13 by a connection 46 to receive a sweep signal from the generator 13.

The tube 12 also includes a fiber optics array or strip 19 inserted into the faceplate 16. A photosensitive record sheet 20 is advanced at a predetermined rate, upwardly as seen in FIG. 3, over the strip 19 from a supply roll, not shown, to a take-up roll 21, by means of a suitable motor 22.

The data input channel 11 includes an input terminal 23 to which the analog data or input signal S is applied, a buffer amplifier 24, and amplitude-detector circuits or channels A and B. Each of said channels A and B includes a respective input analog gate 25, 26, a respective amplitude or peak and valley detector 27, 28, and a respective pair of output analog gates 29, 30 and 31, 32.

The input terminal 23 is connected to the input terminal of the buffer amplifier 24, and the output terminal of the latter is connected to the input terminal of each of the input analog gates 25 and 26. The output terminal of the gate 25 is connected to the input terminal of the detector 27, and the output terminal of the gate 26 is connected to the input terminal of the detector 28. Therefore, when either of the gates 25 and 26 is open, the signal on the terminal 23 is applied to the input terminal of the respective one of the detectors 27 and 28.

Each of the detectors 27 and 28 has an upper output terminal, which is a maximum output terminal, and a lower output terminal, which is a minimum output terminal. Each output terminal of the detector 27 is connected to the input terminal of a respective one of the output analog gates 29 and 30. Similarly, each output terminal of the detector 28 is connected to the input terminal of a respective one of the output analog gates 31 and 32. The output terminals of the output analog gates 29 and 31 are connected to one input terminal of a comparator 33, and the output terminals of the output analog gates 30 and 32 are connected to a similar input terminal of a comparator 34. A ramp signal from the generator 13 is applied by a ramp signal connection 47 to each of the other input terminals of the comparators 33 and 34. The output terminal of each of the comparators 33 and 34 is connected to an individually associated input terminal of the EXCLUSIVE OR gate 15.

Each of the analog gates 25, 26, 29, 30, 31, and 32 is of the type which is open, and hence allows signals to pass from its input terminal to its output terminal, only in the presence of a signal on its bottom or control terminal. Each of the detectors 27 and 28 is of the type which produces on its maximum (upper) output terminal an output or signal of a value which is representative of, and will be assumed herein to be equal to, the highest value which the signal applied to its input terminal has had since the detector was last reset. Such resetting is accomplished by applying a reset signal to the bottom or reset terminal of the detector. Further, each of the detectors 27 and 28 produces on its minimum (lower) output terminal an output or signal of a value which is representative of, and will be assumed herein to be equal to, the lowest value which said signal applied to its input terminal has had since the detector was last reset. Each of the comparators 33 and 34 produces a signal on its output terminal only as long as the value of the ramp signal on its one input terminal exceeds the value of the signal applied to the other of its input terminals.

STORE, RESET, and RECORD signals for the channels A and B are derived from a circuit portion indicated at 35 having an input terminal 36 to which the square wave clock pulse signal is supplied from the generator 13 by a connection 48. The input terminal 36 is connected to an input terminal of each of two inverters indicated at 37 and 38, to the input terminal of a flip-flop indicated at 39, and to one input terminal of each of two AND gates indicated at 40 and 41. The output terminal of each of the inverters 37 and 38 is connected to one input terminal of an individually associated AND gate 42 and 43.

The other input terminals of the AND gates 40 and 42 are connected together and to one output terminal 39a of the flip-flop 39. That output terminal is also connected to a conductor identified in FIG. 3 as STORE B, and is connected by that conductor to the control terminal of the input analog gate 26 to provide a STORE signal to that gate. The other input terminals of the AND gates 41 and 43 are connected together and to the other output terminal 39b of the flip-flop 39. That output terminal of the flip-flop 39 is connected to a conductor identified as STORE A, and is connected by that conductor to the control terminal of the input analog gate 25 to provide a STORE signal to that gate.

The flip-flop 39 is of the type which always produces a signal at one or the other of its output terminals 39a and 39b, and which shifts the output signal from one output terminal to the other each time that a negative-going signal appears at its input terminal. As a result, at the end of each of the positive pulses of the clock signal on the terminal 36, the STORE signal which has been present on one of the STORE A and STORE B conductors shifts to the other of these conductors.

The output terminal of the AND gate 42 is connected by a conductor identified as RECORD A to the control terminals of the output analog gates 29 and 30 to provide a RECORD signal to those gates. The output terminal of the AND gate 40 is connected by a conductor identified as RESET A to the reset terminal of the peak and valley detector 27 to provide a RESET signal to that detector. Similarly, the output terminal of the AND gate 43 is connected by a RECORD B conductor to the control terminals of the output analog gates 31 and 32 to provide a RECORD signal to those gates, and the output terminal of the AND gate 41 is connected by a RESET B conductor to the reset terminal of the detector 28 to provide a RESET signal thereto.

Each of the AND gates 40, 41, 42, and 43 is of the conventional type, and thus produces an output signal only when an input signal is present on both of its input terminals simultaneously.

Operation of the FIG. 3 Apparatus

The operation of the FIG. 3 apparatus will now be explained by describing the manner in which that apparatus produces the recorded curve of FIG. 2 in response to the application to the input terminal 23 of the analog or input signal represented by the curve S of FIG. 2. To this end, it is noted that the sweep signal supplied to the deflection coil 18 over the conductor 46 is a sawtooth wave signal which establishes a deflection or sweep path for the beam of the cathode ray tube 12. As shown in FIG. 2, this path consists of successive sweep portions, shown by the light solid lines labeled Sweep No. 1, Sweep No. 2, etc., and alternate retrace or flyback portions, shown by the dash lines labeled Retrace No. 1, Retrace No. 2, etc. However, the cathode ray tube beam is normally blanked or off, and marks the record sheet 20 along the sweep path only when an output signal is present at the output terminal of the EXCLUSIVE OR gate 15.

The interval or period for a complete sweep, and hence for a complete wave or cycle of the sweep signal, includes the time required for the beam to be deflected along the corresponding sweep portion plus the time required for the beam to be deflected back along the following retrace portion. For the first sweep shown in FIG. 2, this interval is identified as $A_1$. For the second, third, fourth, fifth, and sixth sweeps, this complete sweep interval is identified as $B_1$, $A_4$, $B_4$, $A_7$, and $B_7$, respectively.

Further, the interval for the sweep portion of the second complete sweep is identified in FIG. 2 as $A_2$, and the interval for the retrace portion of this second sweep is identified as $A_3$. Similarly, the sweep intervals for the third and fourth sweeps are $B_2$ and $A_5$, respectively, and the retrace intervals for those sweeps are $B_3$ and $A_6$, respectively.

The ramp signal supplied to the comparators 33 and 34 over the conductor 47 is a sawtooth wave signal which rises and falls in synchronism with the sweep signal. Accordingly, the distance along each sweep path from the start thereof at any instant represents the value of the raamp signal at that instant.

The clock pulse signal supplied to the terminal 36 is a square wave signal which is zero during the sweep intervals $A_2$, $B_2$, etc., and which is positive during the retrace intervals $A_3$, $B_3$, etc. Thus, this signal consists of a series of positive square wave pulses, each of which extends throughout a corresponding one of the retrace intervals. The waveform and phase relation of this signal are shown in FIG. 2 by the curve C.

The first complete sweep illustrated in FIG. 2, and having the interval $A_1$, is one in which the minimum and maximum values achieved by the input signal during the interval $A_1$ are determined and stored by the channel A detector 27 for use in the second sweep. Also during this interval $A_1$, the input signal minimum and maximum values determined and stored by the channel B detector 28 during the immediately previous sweep, not shown, are used to produce the recorded line segment designated 4 in FIG. 2.

In consonance with the foregoing, let it be assumed that, throughout the interval $A_1$, the terminal 39b is the flip-flop output terminal at which there is a signal. Accordingly, throughout this interval there is a STORE A signal applied to the control terminal of the input gate 25, the latter is open, the input signal is applied to the detector 27, and the latter produces at its respective output terminals signals having the minimum and maximum values which the input signal achieves during the interval $A_1$. This minimum value is represented by the point designated a in FIG. 2, and this maximum value is represented by the point designated b.

Since, throughout the interval $A_1$, there is no signal on the flip-flop output terminal 39a, no signals are produced by the AND gates 40 and 42. Hence, no RESET A signal is applied to the detector 27, and no RECORD A signal is produced to open the output gates 29 and 30. Accordingly, the minimum value a and the maximum value b signals are held or stored on the output terminals of the detector 27 during the interval $A_1$ for use in the next or second sweep.

The absence of a signal on the flip-flop output terminal 39a also results in no STORE B signal being supplied to the input gate 26. Thus, during the interval $A_1$, the gate 26 is not open, and the input signal is not applied to the detector 28. This isolates the latter to permit the utilization in this interval of the minimum and maximum values of the input signal which were determined and stored by the detector 28 during the previous, unillustrated sweep interval.

During the interval $A_1$, the AND gates 41 and 43 provide RECORD B and RESET B signals to the channel B at appropriate times under the control of the clock signal C. This causes the cathode ray beamm to produce the above-noted line segment 4, and the detector 28 to then be reset. Since this segment 4 is based upon the input signal minimum and maximum values which occurred and were stored by the detector 28 in the previous sweep, which took place before the first sweep illustrated in FIG. 2, further details as to the production of the segment 4 will be omitted from the present description in order to avoid unduly complicating the same.

Considering now the second complete sweep and its interval $B_1$, which immediately follow the first complete sweep and its interval $A_1$, it is noted that this second sweep is one in which the following two events occur:

1. The input signal minimum and maximum values a and b determined and stored by the channel A detector 27 during the previous interval $A_1$ are used to produce the recorded line segment designated 5 in FIG. 2; and
2. The minimum and maximum values achieved by the input signal during the interval $B_1$ are determined and stored by the reset channel B detector 28 for use in the immediately following or third sweep.

The manner in which these actions take place will now be described.

At the end of the interval $A_1$, and the start of the interval $B_1$, the clock signal C at the input terminal 36 drops from a positive value to zero, as shown in FIG. 2. This causes the flip-flop output signal to switch from the terminal 39b to the terminal 39a, where it remains for the duration of the interval $B_1$. As a result, the STORE A signal of the interval $A_1$ is terminated, the input gate 25 closes, and the input signal is removed from the detector 27. Accordingly, the interval $B_1$ starts with the isolated detector 27 storing output signals having the values a and b for use in this interval.

The beginning of the interval $B_1$ is also the beginning of the Sweep No. 2 interval $A_2$. Throughout this latter interval, the clock signal C remains at zero, and thus prevents the AND gate 40 from producing a RESET A signal for the detector 27. However, this zero clock signal causes the inverter 37 to apply a signal to the AND gate 42. This signal, in cooperation with the signal on the flip-flop output terminal 39a, causes the AND gate 42 to produce a RECORD A signal which opens the output gates 29 and 30. As a result, the signals stored on the detector 27 outputs, and having the input signal minimum and maximum values a and b, respectively, are applied to the inputs of the respective comparators 34 and 33 throughout the interval $A_2$. Specifically, the signal having the minimum value a is applied to the comparator 34, and the signal having the maximum value b is applied to the comparator 33.

The ramp signal applied to the comparators 33 and 34 by the conductor 47 starts to rise at the beginning of the interval $A_2$, as does the sweep signal which establishes the Sweep No. 2 path for the cathode ray beam. When the ramp signal reaches the minimum value a, the comparator 34 produces an output signal which causes the EXCLUSIVE OR gate 15 to produce an output signal. The latter signal turns on the cathode ray beam via the amplifier 14, and the beam then starts to produce the line segment 5 from the point designated $a'$.

The cathode ray beam continues to move along the Sweep No. 2 path and to produce the line segment 5 until the ramp signal reaches the maximum value b. At that time, the comparator 33 produces an output signal. Since there are now signals on both of the inputs of the EXCLUSIVE OR gate 15, the output signal of the latter disappears, and the cathode ray beam is turned off or blanked. Accordingly, the line segment 5 ends at a point representing the value b. Thus, the line segment 5 is produced during the interval $A_2$ between the points which represent the minimum and maximum values a and b, respectively, of the input signal which the detector 27 determined and stored during the previous interval $A_1$.

The ramp and sweep signals continue to rise until the end of the interval $A_2$. At that time, these signals start to decrease rapidly, ending Sweep No. 2 and establishing the Retrace No. 2 interval $A_3$. Also at the end of the interval $A_2$ and the start of the interval $A_3$, the clock signal C at the terminal 36 rises to its positive value, which is maintained throughout the interval $A_3$.

As soon as the clock signal C rises, the output signals of the inverter 37 and the AND gate 42 disappear, removing the RECORD A signal from the output gates 29 and 30. Consequently, the latter close, removing the minimum and maximum signals from the inputs of the comparators 34 and 33. The outputs of the comparators then disappear.

The positive clock signal C also causes the AND gate 40 to produce a RESET A signal which resets the detector 27 throughout the interval $A_3$, causing its output signals to go to zero. Accordingly, the detector 27 is in a reset condition at the end of the interval $A_3$, which is also the end of the interval $B_1$. The detector 27 is thus ready to store the input signal minimum and maximum values during the next or third sweep interval $A_4$.

The presence of the signal on the flip-flop output terminal 39a throughout the interval $B_1$ causes a STORE B signal to be applied to the input gate 26, to maintain the latter open, throughout the interval $B_1$. Therefore, throughout this interval, the input signal is applied to the detector 28, and the latter produces at its respective output terminals signals having the minimum and maximum values which the input signal achieves during the interval $B_1$. This minimum value is the maximum value $b$ from the first sweep interval $A_1$, since the input signal increases continually throughout the second sweep interval $B_1$. The maximum value of the input signal for the second sweep interval $B_1$ is represented by the point designated $c$ in FIG. 2.

Since there is no signal on the flip-flop output terminal 39b throughout the interval $B_1$, no signals are produced by the AND gates 41 and 43, and no RECORD B or RESET B signals are produced, during this interval. Thus, the output gates 31 and 32 remain closed, allowing the detector 28 to store the minimum and maximum input signal values $b$ and $c$ of the interval $B_1$ for use in producing the line segment 6 in the next or third sweep.

At the end of the intervals B1 and $A_3$, the ramp, sweep, and clock signals arrive at zero, ready for the third sweep. The RESET A signal is terminated, and the reset detector 27 is ready to store the minimum and maximum input signal values during the third sweep. Also, the detector 28 is ready to have its stored signal values recorded during the third sweep.

Considering now the third complete sweep and its interval $A_4$, which immediately follow the second complete sweep and its interval $B_1$, it is noted that this third sweep is one in which the following two events occur:
1. The input signal minimum and maximum values $b$ and $c$ determined and stored by the channel B detector 28 during the previous interval $B_1$ are used to produce the recorded line segment 6; and
2. The minimum and maximum values achieved by the input signal during the interval $A_4$ are determined and stored by the reset channel A detector 27 for use in the immediately following or fourth sweep.

The manner in which these actions take place will now be described.

At the end of the interval $B_1$, and the start of the interval $A_4$, the drop of the clock signal C to zero causes the flip-flop output signal to switch from the terminal 39a to the terminal 39b, where it remains for the duration of the interval $A_4$. As a result, the STORE B signal of the interval $B_1$ is terminated, the input gate 26 closes, and the input signal is removed from the detector 28. Accordingly, the interval $A_4$ starts with the isolated detector 28 storing output signals having the values $b$ and $c$ for use in this interval.

The beginning of the interval $A_4$ is also the beginning of the Sweep No. 3 interval $B_2$. Throughout this latter interval, the clock signal C remains at zero, and thus prevents the AND gate 41 from producing a RESET B signal for the detector 28. However, this zero clock signal causes the inverter 38 to apply a signal to the AND gate 43. This signal, in cooperation with the signal on the flip-flop output terminal 39b, causes the AND gate 43 to produce a RECORD B signal which opens the output gates 31 and 32. As a result, the signals stored on the detector 28 outputs, and having the input signal minimum and maximum values $b$ and $c$, respectively, are applied to the inputs of the respective comparators 34 and 33 throughout the interval $B_2$.

As the ramp signal rises in the interval $B_2$, the comparator 34 and the EXCLUSIVE OR gate 15 produce output signals when the minimum value $b$ is reached. Thus, the cathode ray beam starts to produce the line segment 6 from the point designated $b'$. The beam continues to move along the path of Sweep No. 3 and to produce the line segment 6 until the ramp signal reaches the maximum value $c$, at which time the comparator 33 output signal appears and the gate 15 output signal disappears. This causes the beam to be blanked, and the line segment 6 to end at a point representing the value $c$.

Accordingly, the line segment 6 is drawn during the interval $B_2$ between the points which represent the minimum and maximum values $b$ and $c$, respectively, of the input signal which the detector 28 determined and stored during the previous interval $B_1$.

The ramp and sweep signals continue to rise until the end of the interval $B_2$. At that time, these signals start to decrease rapidly, ending Sweep No. 3 and establishing the Retrace No. 3 interval $B_3$. Also at the end of the interval $B_2$ and the start of the interval $B_3$, the clock signal C at the terminal 36 rises to its positive value, which is maintained throughout the interval $B_3$.

The noted rise of the clock signal C causes the output signals of the inverter 38 and the AND gate 43 to disappear, removing the RECORD B signal from the output gates 31 and 32. Consequently, the latter close, removing the minimum and maximum signals from the inputs of the comparators 34 and 33. The output of the latter then disappear.

The positive clock signal also causes the AND gate 41 to produce a RESET B signal which resets the detector 28 throughout the interval $B_3$ causing its output signals to go to zero. Accordingly, the detector 28 is in a reset condition at the end of the interval $B_3$, which is also the end of the interval $A_4$. The detector 28 is thus ready to store the input signal minimum and maximum values during the next or fourth sweep interval $B_4$.

The presence of the signal on the flip-flop output terminal 39b throughout the interval $A_4$ causes a STORE A signal to be applied to the input gate 25, to maintain the latter open, throughout the interval $A_4$. Therefore, throughout this interval, the input signal is applied to the detector 27, and the latter produces at its respective output terminals signals having the minimum value $c$ and the maximum value $d$ which the input signal achieves during the interval $A_4$, as shown in FIG. 2.

Since there is no signal on the flip-flop output terminal 39a throughout the interval $A_4$, no signals are produced by the AND gates 40 and 42, and no RECORD A or RESET A signals are produced, during this interval. Thus, the output gates 29 and 30 remain closed, allowing the detector 27 to store the values $c$ and $d$ of the interval $A_4$ for use in producing the line segment 7 in the next or fourth sweep.

At the end of the intervals $A_4$ and $B_3$, the ramp, sweep, and clock signals again arrive at zero, ready for the fourth sweep. The RESET B signal is terminated, and the reset detector 28 is ready to store the minimum and maximum input signal values during the fourth sweep. Also, the detector 27 is ready to have its stored signal values recorded during the fourth sweep.

The apparatus of FIG. 3 continues to operate in the foregoing manner to produce or record the remainder of the line segments illustrated in FIG. 2 as occurring during the remainder of the illustrated sweep intervals. As is clear from FIG. 2, all of these line segments are substantially parallel to one another, and the succession of these line segments forms the recorded trace or curve produced by the apparatus. As is true for the line segments already described, the length of each of the remaining line segments corresponds to the difference between the minimum and maximum values of the input signal as sensed and stored during the immediately preceeding sweep interval.

As is the case with the showing of FIG. 1, the various lines of FIG. 2 have been shown, for clarity of explanation, with exaggerated spacing along the horizontal or time axis. In practice, the record sheet 20 would be moved across the cathode ray tube strip 19 at such a slower rate that successive line segments would be sufficiently close to each other to make the resulting curve, which these segments form, appear to be substantially continuous.

The practical superiority of the apparatus of the present invention, as compared with the prior art apparatus previously described in connection with FIG. 1, can be clearly seen by noting particularly the events of the fifth sweep interval $A_7$ and the sixth sweep interval $B_7$. During the interval $A_7$ of FIG. 2, the input signal S rises from a low value $e$ to a peak value $f$, and then drops to a lower value $g$. During Sweep No. 6 of the immediately following interval $B_7$, the cathode ray beam produces the recorded line segment 8, in the same manner as that previously described for the production of the line segments 4 through 7. Thus, the line segment 8 is produced between points representing the minimum value $g$ and the maximum value $f$ which the input signal achieved during the previous interval $A_7$.

Since the line segment 8 thus extends between the values $g$ and $f$, this segment accurately portrays the variation in the value of the signal S which occurred during the fifth sweep interval $A_7$, notwithstanding the abrupt change of direction and peak which the signal S experienced during that interval. The practical importance and significance of this is seen by referring to FIG. 1, from which it is seen that the line segment 8A, which is the line segment produced by the noted prior art apparatus to represent the variations in the signal S during the fifth sweep interval, does not show that the signal S rose to the value $f$ during that interval. Moreover, non of the subsequent line segments of the FIG. 1 recorded curve shows this information.

Consequently, the peak value of the signal S which occurred during the fifth interval is never recognized nor recorded by the prior art apparatus, and the information represented by this peak value is thus lost. However, as shown in FIG. 2, the record produced by the apparatus according to the present invention does show the peak value $f$ which the input signal experienced.

A further example of the superiority of the apparatus of the present invention can be seen by comparing the line segment 9 of FIG. 2 with the line segment 9A of FIG. 1, both of which segments are intended to show the variations in the value of the signal S which occur during the eighth sweep interval. During that interval, the signal S dips to a value $j$. The line segment 9, produced in accordance with the present invention, shows this fact, but neither the line segment 9A, nor any other line segment produced by the noted prior art apparatus, shows that the signal S dropped to the value $j$.

It is thus seen from a comparison of the recorded curves of FIGS. 2 and 1, which are composed of their respective series of line segments, that the apparatus according to the present invention provides an accurate and faithful record of the value of the signal S, whereas the noted prior art apparatus fails to do this by failing to detect some signal values, such as the illustrated values $f$ and $j$.

Summary of the Operation of the FIG. 3 Apparatus

To summarize the operation of the FIG. 3 apparatus in producing the superior recorded curves of the type illustrated by the recorded curve of FIG. 2, it is noted that the channels A and B operate in a complementary manner, during successive alternate ones of the sweep intervals, to determine and hold or store values representative of the minimum and maximum excursions of the input signal S during the corresponding intervals, and to present their respective stored values as outputs to the corresponding comparators for recording without appreciable degradation. Following each such presentation and recording, the channel which has presented its stored values is reset to zero in preparation for again storing the minimum and maximum input signal excursions in the following interval.

By so alternating the alternate storing and recording operations between the channels A and B, one channel is always determining the minimum and maximum input signal excursions and holding this information, while the other channel is concurrently presenting its stored information to be recorded. As a result, the input signal is essentially continuously sampled, and its minimum and maximum values are essentially continuously determined and stored. Accordingly, little, if any, data is lost in the recording process, the only limitation being the speed at which the input and output gates may be switched, and the slewing rates of the amplifying and detecting circuits.

As a result of providing the foregoing operation, there is essentially no tendency, as there is in the noted prior art apparatus, for abrupt changes or transients in the input signal, such as peaks and valleys, to be ignored, or for the corresponding information or data to be lost. Instead, the presence of such input signal changes is faithfully recorded.

Although the apparatus illustrated in FIG. 3 is one which is constructed and arranged to produce a display of but a single input signal, it will be evident that such apparatus may be modified to produce multi-channel displays of the values of a plurality of input signals simultaneously. This can be readily accomplished by employing the time sharing techniques disclosed in the aforementioned U.S. Pat. No. 3,605,109.

The FIG. 4 Generator

An example of a device that can be used as the ramp, deflection, and clock signal generator 13 is illustrated in FIG. 4. In that figure, the generator 13 is shown as including one-shots 50 and 51, a transistor 52, resistors 53 and 54, a diode 55, a capacitor 56, a power source, shown as a battery 57, and a ramp signal amplifier 58. The one-shot 50 is constructed to have a period equal to each of the desired sweep intervals $A_2$, $B_2$, etc., while the one-shot 51 is constructed to have a period equal to each of the desired retrace or flyback intervals $A_3$, $B_3$, etc. The sum of the periods of the one-shots 50 and 51 is thus equal to each of the complete sweep intervals $A_1$, $B_1$, etc.

The $\bar{Q}$ output of the one-shot 50 is connected to the trigger input of the one-shot 51, while the $\bar{Q}$ output of the latter is connected to the trigger input of the one-shot 50. The Q output of the latter is connected through the resistor 53 to the base of the transistor 52, while the emitter of the transistor 52 is connected to a conductor 59 which is common to the circuits of the one-shots 50 and 51.

The collector of the transistor 52 is connected in series with the cathode ray tube deflection coil 18, by way of the sweep signal connection 46 and the resistor 54, to the positive terminal of the battery 57. The negative terminal of the battery is connected to the common connection 59. The diode 55 and the capacitor 56 are connected in parallel between the transistor collector and emitter. The input terminals of the amplifier 58 are connected across the resistor 54, while the output of this amplifier is connected to the ramp signal connection 47. The $\bar{Q}$ output of the one-shot 50 is connected to the clock connection 48.

As previously explained, the generator 13 serves to produce the sawtooth sweep signal which is supplied to the deflection coil 18 by the connection 46, the sawtooth ramp signal which is supplied to the comparators 33 and 34 by the connection 47, and the square wave clock signal which is applied to the input terminals of the inverters 37 and 38, the flip-flop 39, and the AND gates 40 and 41 by the connection 48. The generator 13 of FIG. 4 accomplishes this in a manner which will now be described.

The interconnected one-shots 50 and 51 produce through the resistor 53 a pulse signal which is high throughout the sweep intervals $A_2$, $B_2$, etc., and which is low during the retrace intervals $A_3$, $B_3$, etc. This signal drives the base of transistor 52, which, in turn, with the cooperation of the diode 55 and the capacitor 56, produces the necessary deflection current through the coil 18 and the resistor 54. The current flowing through the coil 18 and the resistor 54, and the voltage across the latter, are proportional to the deflection of the cathode ray tube beam. This voltage is amplified by the amplifier 58 to become the ramp signal on the connection 47.

As noted above, the period of the one-shot 51 is equal to the retrace interval $A_3$, $B_3$, etc. As a result, the signal produced at the $\bar{Q}$ output of the one-shot 50 and on the connection 48 is high throughout each retrace interval and is low throughout the intervening sweep intervals. This signal is thus the desired clock signal described hereinbefore and illustrated by the FIG. 2 curve C.

The FIG. 5 Unblanking Amplifier

An example of a device which can be used as the unblanking amplifier 14 is illustrated in FIG. 5. As there shown, the amplifier 14 includes a transistor 60, resistor 61 and 62, and a power source 63, shown as a battery. In this amplifier, one conductor of the connection from the output of the EXCLUSIVE OR gate 15 is connected to the base of the transistor 60, while the other conductor of that connection is connected to the transistor emitter and to one of the conductors of the output connection 44. The other conductor of the output connection 44 is connected to the transistor collector. The resistor 61 connects the transistor base to the positive terminal of the battery 63, while the resistor 62 connects the transistor collector to the positive terminal of the battery 63. The negative terminal of the battery 63 is connected to the transistor emitter.

In operation, the unblanking amplifier 14 serves to unblank the tube 12 at all times at which a signal is present at the output of the gate 15. The form of the device 14 shown in FIG. 5 accomplishes this in the following manner. When no signal is present at the gate 15 output, the transistor 60 is off, and no signal is applied over the connection 44 to affect the normally blanked condition of the tube 12. When a signal appears at the gate 15 output, however, this signal turns on the transistor 60. The latter then drives the cathode 17 of the tube 12 sufficiently negative to cause the tube to become unblanked.

Figure 6:
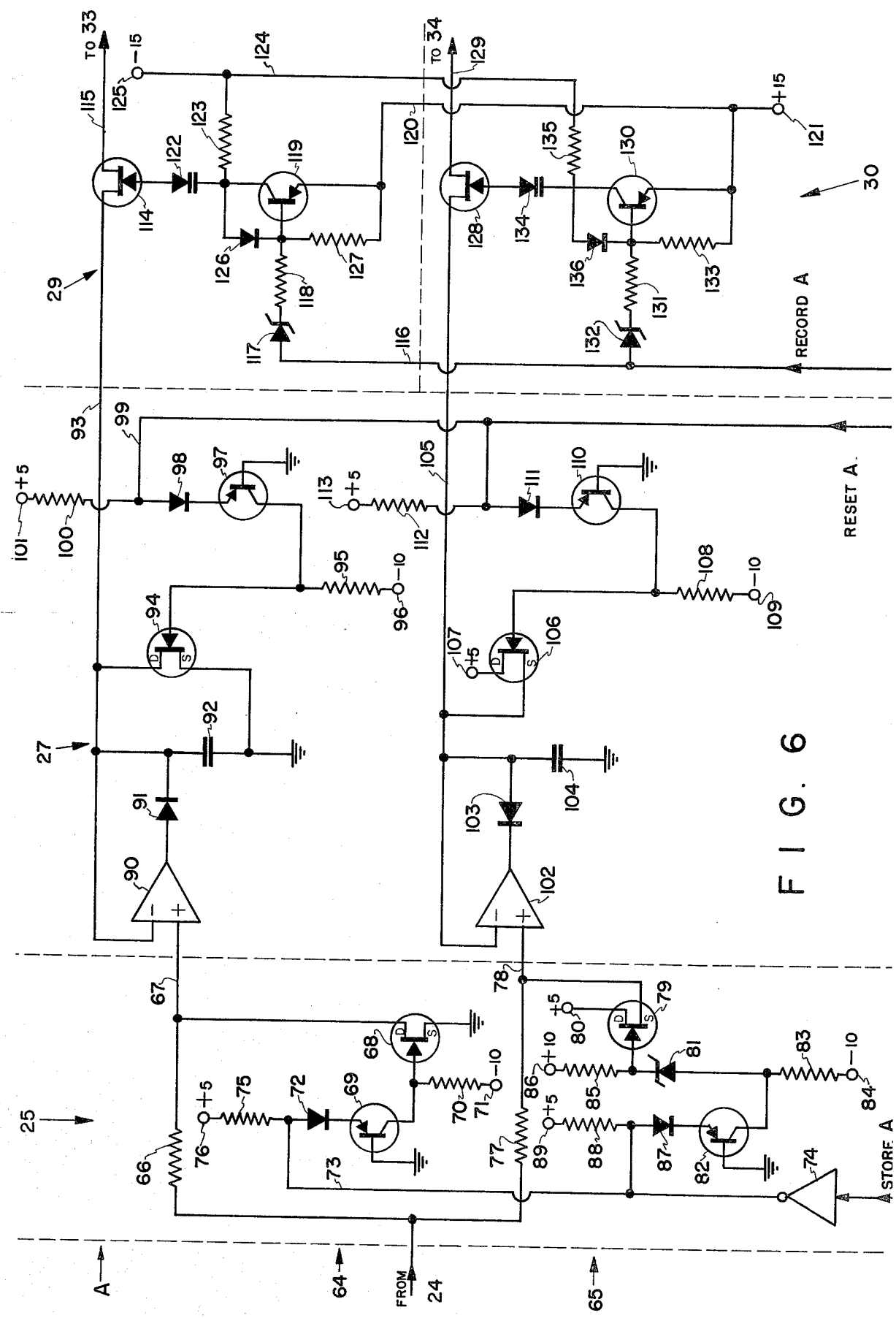
FIG. 6 is a diagram of an arrangement which is useful as the amplitude-detector channels of the FIG. 3 apparatus.

The Circuit of FIG. 6

FIG. 6 shows the circuit diagram of an arrangement which can be used as the channel A of the FIG. 3 apparatus. This example of the form which the channel A may take includes the circuits for the input analog gate 25, the detector 27, and the output analog gates 29 and 30. The FIG. 6 circuit consists of an upper or maximum half 64, which provides the above-noted maximum output signal which is equal to the maximum value of the signal from the amplifier 24, and a lower or minimum half 65 which provides the above-noted minimum output signal which is equal to the minimum value of the signal from the amplifier 24. An arrangement of the type shown in FIG. 6 can also be used as the channel B of the FIG. 3 apparatus.

The upper or maximum half of the input analog gate 25 includes a resistor 66 which connects the gate input terminal, that connected to the output terminal of the amplifier 24, to a gate output terminal or connection 67. The latter is also an input terminal or connection of the upper or maximum half of the detector 27.

The connection 67 is also connected to the drain of a field effect transistor (FET) 68, the source of which is connected to apparatus common. The gate of the FET 68 is connected to the collector of a transistor 69, and is connected through a resistor 70 to a −10 volt supply terminal 71. This terminal, as well as the other supply terminals to be referred to hereinafter, are intended to be connected to a conventional power supply, not shown, which, in the usual manner, provides the noted voltages between each of the corresponding supply terminals and apparatus common. It is noted that the specific supply terminal voltages shown herein are so shown solely by way of example, in order to show the relative polarities of the several supply terminals.

The base of the transistor 69 is connected to apparatus common. The emitter of the transistor 69 is connected through a diode 72 to a control connection 73 which, in turn, is connected to the output terminal of an inverter 74. The input terminal of the latter is the control terminal of the gate 25, which is the terminal connected to the previously described STORE A conductor. The connection 73 is also connected through a resistor 75 to a +5 volt supply terminal 76.

The lower or minimum half of the gate 25 includes a resistor 77 which connects the gate input terminal to another gate output connection 78. The latter is also the input connection to the lower or minimum half of the detector 27.

The connection 78 is also connected to the source of an FET 79, the drain of which is connected to a +5 volt supply terminal 80. The gate of the FET 79 is connected through a zener diode 81 to the collector of a transistor 82, which is also connected through a resistor 83 to a −10 volt supply terminal 84. The gate of the FET 79 is also connected through a resistor 85 to a +10 volt supply terminal 86.

The base of the transistor 82 is connected to apparatus common. The emitter of the transistor 82 is connected through a diode 87 to the above-noted control connection 73, and is connected through a resistor 88 to a +5 volt supply terminal 89.

The upper or maximum half of the detector 27 includes an operational amplifier 90 having an high input impedance. The non-inverting (+) input terminal of the amplifier 90 is connected to the input connection 67, and the amplifier output terminal is connected through a diode 91 and a memory capacitor 92 to apparatus common. The junction between the diode 91 and the capacitor 92 is connected to the maximum output terminal of the detector 27, shown as a connection 93. The latter is also connected to the inverting (−) input terminal of the amplifier 90.

The drain of an FET 94 is connected to the output connection 93. The source of the FET 94 is connected to apparatus common. The gate of the FET 94 is connected through a resistor 95 to a −10 volt supply terminal 96, and is connected to the collector of a transistor 97.

The base of the transistor 97 is connected to apparatus common. The emitter of the transistor 97 is connected through a diode 98 to a reset connection 99. The latter constitutes the reset terminal of the detector 27, which is connected to the previously described RESET A conductor. The connection 99 is also connected through a resistor 100 to a +5 volt supply terminal 101.

The lower or minimum half of the detector 27 includes an operational amplifier 102 having a high input impedance. The non-inverting (+) input terminal of the amplifier 102 is connected to the input connection 78, and the amplifier output terminal is connected through a diode 103 and a memory capacitor 104 to apparatus common. The junction between the diode 103 and the capacitor 104 is connected to the minimum output terminal of the detector 27, shown as a connection 105. The latter is also connected to the inverting (−) input terminal of the amplifier 102.

The source of an FET 106 is connected to the output connection 105. The drain of the FET 106 is connected to a +5 volt supply terminal 107. The gate of the FET 106 is connected through a resistor 108 to a −10 volt supply terminal 109, and is connected to the collector of a transistor 110.

The base of the transistor 110 is connected to apparatus common. The emitter of the transistor 110 is connected through a diode 11 to the reset connection 99. The latter is also connected through a resistor 112 to a +5 volt supply terminal 113.

The maximum output connection 93 constitutes also the input terminal of the output analog gate 29. In the latter, the source-drain path of an FET 114 connects the input connection 93 to an output connection 115, which constitutes the output terminal of the gate 29. As noted previously, this terminal if the one which is connected to one of the input terminals of the maximum comparator 33.

A connection 116 constitutes the control terminal of the gate 29, which terminal is connected to the previously described RECORD A conductor. The connection 116 is connected through a zener diode 117 and a resistor 118 to the base of a transistor 119. The emitter of the latter is connected by a connection 120 to a +15 volt supply terminal 121.

The collector of the transistor 119 is connected through a voltage variable capacitance diode 122 to the gate of the FET 114, and is connected through a resistor 123 to a conductor 124 which, in turn, is connected to a −15 volt supply terminal 125. A diode 126 is connected between the collector and the base of the transistor 119, and a resistor 127 is connected between the base and the emitter of that transistor.

The minimum output connection 105 is also the input terminal of the output analog gate 30, the circuit of which is the same as that of the gate 29. Thus, in the gate 30, the source-drain path of an FET 128 connects the input connection 105 to an output connection 129. The latter constitutes the output terminal of the gate 30, and this terminal is the one which is connected to one of the input terminals of the minimum comparator 34, as previously described.

The gate 30 also includes a transistor 130, the base of which is connected through a resistor 131 and a zener diode 132 to the RECORD A connection 116. The base of the transistor 130 is also connected through a resistor 133 to the transistor emitter, which, in turn, is connected to the connection 120.

The collector of the transistor 130 is connected through a voltage variable capacitance diode 134 to the gate of the FET 128, and is connected through a resistor 135 to the connection 124. A diode 136 is connected between the collector and the base of the transistor 130.

By way of illustration and example, and not by way of limitation, it is noted that an assembly embodying the circuitry of the FIG. 6 gates 29 and 30, and identified as the Crystalonics Dual FET Analog Gate, Type CAG13, is illustrated and described on Page 158.10 of the Crystalonics Silicon Semiconductor Devices Annual Catalog for Fall, 1968.

Operation of the Circuit of FIG. 6

This explanation begins with the assumption that there are no STORE A, RECORD A, or RESET A signals present on their respective conductors, and that the capacitors 92 and 104 have been reset. The channel A is thus assumed to be ready to store the maximum and minimum values which the input signal achieves or attains during the next storing or STORE A interval for the channel A, such as the interval A₁.

As previously noted herein, when there is no STORE A signal produced on the STORE A conductor, the gate 25 is to be closed and thus prevent the signal from the amplifier 24, hereinafter referred to as the input signal, from reaching the detector 27. In the FIG. 6 apparatus, the absence of a STORE A signal at the input terminal of the inverter 74 causes the latter to produce a positive signal on the control connection 73. This signal causes the transistor 69 to be on, whereby the potential of the gate of the FET 68 is raised to approximately the potential of its source. As a result, the FET 68 is on, and effectively connects the output connection 67 and the non-inverting input terminal of the amplifier 90 to apparatus common. Accordingly, the maximum half of the detector 27 is effectively decoupled from the output of the amplifier 24.

The positive signal on the control connection 73 also causes the transistor 82 to be on. Thus, the FET 79 is on, and the output connection 78 and the non-inverting input of the amplifier 102 are effectively connected to the +5 volt supply terminal 80. Accordingly, the minimum half of the detector 27 is effectively decoupled from the output of the amplifier 24.

Summarizing the foregoing, it is noted that when no STORE A signal is present, the gate 25 is closed, since both of the FET's 68 and 79 are on, and both halves of the detector 27 are effectively decoupled or isolated from the output of the amplifier 24.

The appearance of a STORE A signal at the input of the inverter 74, as occurs at the beginning of the STORE A interval A₁, for example, causes the gate 25 to open. This occurs because this signal causes the output signal of the inverter 74 on the control connection 73 to go to zero. For this condition, the transistor 69 turns off, turning off the FET 68. Similarly, the transistor 82 and the FET 79 turn off. Consequently, the input signal appears on the connections 67 and 78 at this time, and remains there as long as the STORE A signal is present.

As a result of the presence of the input signal on the connection 67, a voltage appears on the previously discharged maximum storage capacitor 92, which voltage rises to the most positive value which the input signal attains while the STORE A signal is present. Due to the high input impedance of the amplifier 90, and to the fact that the FET 94 is off at this time, the voltage on the capacitor 92 does not fall between peaks in the input signal. Accordingly, a signal of a value equal to the most positive excursion of the input signal while the STORE A signal is present is produced on the output connection 93.

Previous to the appearance of the STORE A signal, and the appearance of the input signal on the connections 67 and 78, the minimum storage capacitor 104 will have been charged to +5 volts, as will be more fully explained hereinafter. This is the assumed maximum value for the input signal.

As a result of the presence of the input signal on the connection 78, the capacitor 104 discharges, and its voltage drops to the minimum value which the input signal attains while the STORE A signal is present. Due to the nature of the circuit including the capacitor 104, the voltage thereon does not rise with peaks in the input signal. Accordingly, a signal of a value equal to the minimum value achieved by the input signal while the STORE A signal is present is produced on the output connection 105.

At the subsequent time at which the STORE A signal is terminated, such as the end of the interval A₁, for example, the FET's 68 and 79 return to their on conditions to place the gate 25 in its previously described closed condition. Specifically, the FET 68 connects the connection 67 to apparatus common, and the FET 79 connects the connection 78 to the +5 volt supply terminal 80. This latter action does not disturb the minimum value signal now stored on the capacitor 104, and is necessary because of the five volt charge which is placed on the capacitor 104 during the reset periods, as will be described hereinafter.

With the gate 25 so closed, both halves of the detector 27 are once more decoupled from the amplifier 24. The channel A is now storing or holding the maximum and minimum values which the input signal achieved during the STORE A interval in which the STORE A signal was present. Said maximum value is the value of an output signal on the connection 93, which value, in turn, is the value of the voltage on the capacitor 92. Said minimum value is the value of an output signal on the connection 105, which value, in turn, is the value of the voltage on the capacitor 104.

Throughout each STORE A interval in which the channel A is performing its minimum and maximum determining and storing functions, such as the interval just considered, the output analog gates 29 and 30 are to be closed, and no RECORD A signal is present. In the FIG. 6 apparatus, this absence of a RECORD A signal on the connection 116 leaves the FET's 114 and 128 off, and hence causes the gates 29 and 30 to be closed, as is desired. Thus, at the end of the interval just considered, the minimum and maximum signals appear on the effectively isolated connections 105 and 93, respectively.

At the beginning of the next or RECORD A interval for the channel A, such as the interval A₂, for example, the RECORD A signal appears on the connection 116. This signal turns on the FET's 114 and 128. As a result, the maximum signal now appears on the output connection 115, and the minimum signal now appears on the output connection 129. This situation obtains until the end of this RECORD A interval, at which time the RECORD A signal disappears and the FET's 114 and 128 are returned to their off state.

Throughout the above-described STORE A and RECORD A intervals, no RESET A signal is present on the RESET A conductor and the connection 99. As a result, the transistor 97 is off, as is the transistor 110. Accordingly, the FET 94 and the FET 106 are off, and, hence, do not affect the charges on the capacitors 92 and 104.

At the end of the RECORD A interval described above, a RESET A signal appears on the connection 99, starting a RESET A interval such as the interval A₃, for example. The presence of this signal turns on the transistors 97 and 110, whereby the FET's 94 and 106 turn on. The FET 94 now effectively short-circuits the capacitor 92. This reduces the capacitor charge and voltage to zero, and thus resets the capacitor and the maximum half of the detector 27. The on FET 106 effectively connects the +5 volts of the supply terminal 107 to the capacitor 104. This resets the latter by charging it to +5 volts, thereby resetting the minimum half of the detector 27. When the RESET A signal and RESET A interval are subsequently terminated, the transistors 97 and 110 and the FET's 94 and 106 turn off, having the channel A ready to perform its storing operation during its next STORE A interval.

Thus, there has been provided, in accordance with the present invention, an apparatus for producing a faithful graphic display of the variations in amplitude with time of a data signal. To that end, the data signal is repetitively sampled to derive a succession of values each of which represents a successive amplitude condition of the signal, and successive substantially parallel line segments are produced on a display medium, each of such line segments being substantially continuous and being drawn from the minimum to the maximum excursion of the data signal during a previous sampling period. Consequently, if the data signal should undergo an abrupt change of direction between successive sampling periods, the peak-to-peak excursion is detected and graphically displayed on the display medium. Therefore, the apparatus according to the present invention is significantly superior to that of the noted prior art, since the present apparatus has the unique and desirable advantage of capturing and indicating and/or recording abruptly changing or transient signal variations or data which otherwise would be lost if the noted prior art apparatus were employed.

The embodiments of the invention in whcih an exclusive property or privilege is claimed are defined as follows:

1. Apparatus for producing a graphic display of the variations in amplitude of a data signal, comprising
   first means connected to the source of the signal for deriving in successive periods two values, representing, respectively, the minimum value and the maximum value of said signal in each of said periods, and
   second means connected to said first means for producing successive parallel line segments on a display medium during successive ones of said periods, each of said line segments being continuous and extending between two points, the positions of which represent, respectively, the minimum value and the maximum value of said signal derived during a previous one of said periods.

2. Apparatus as specified in claim 1,
   wherein said display medium is a record medium,
   wherein said second means include recording means and means to cause said recording means to record said line segments on said record medium, and
   wherein there is included means for moving said record medium relative to said recording means in a direction which is, for all practical purposes, at right angles to said line segments.

3. Apparatus as specified in claim 1,
   wherein said first means include means for repetitively sampling said data signal to cause said successively derived two values to represent in each of said successive periods the minimum and maximum values of said signal, and
   wherein the positions of said points terminating each of said line segments represent, respectively, the minimum and maximum value of said signal sampled during the immediately previous one of said periods.

4. Apparatus for producing a graphic display of the variations in amplitude of a data signal, comprising
   first means connected to the source of the signal for deriving in successive periods two values, representing, respectively, the minimum value and the maximum value of said signal in each of said periods,
   said first means including means for producing and holding in each of said periods two output signals having respective values which represent, respectively, the minimum and the maximum excursions of the value of said data signal during that period, and
   second means connected to said first means for producing successive parallel line segments on a display medium during successive ones of said periods, each of said line segments being continuous and extending between two points, the positions of which represent, respectively, the minimum value and the maximum value of said signal derived during a previous one of said periods,
   said second means including
   generating means for producing a ramp signal the value of which sweeps progressively between first and second values once during each of said periods,
   comparing means connected to receive and to compare the value of said ramp signal, during each of said periods, and the value of each of said output signals as produced during a corresponding previous one of said periods, and to produce first and second logic signals at the respective times during each sweep of said ramp signal at which the value thereof achieves a predetermined relationship with the respective values of said two output signals, and
   circuit means including means connected to said comparing means and controlled by said logic signals to start the production of each of said line segments upon the production of said first logic signal during the corresponding one of said sweeps, and to stop the production of that line segment upon the production of said second logic signal during that sweep.

5. Apparatus as specified in claim 4,
   wherein said second means further include display medium marking means and scanning means connected to said generating means for effectively sweeping said marking means across said display medium in synchronism with said sweeping of said ramp signal value, and
   wherein said circuit means further include activating means for activating said marking means to cuase it to mark said medium only for the time period during each of said sweeps in which the value of said ramp signal lies between the minimum and maximum values had by said data signal during said corresponding one of said previous periods.

6. Apparatus as specified in claim 5, wherein said marking means include means for producing a cathode ray tube beam only throughout each of the last-mentioned time periods.

7. Apparatus as specified in claim 4, wherein said producing and holding means include a pair of measure and hold channels which are operative, in complementary manner, during successive alternate ones of said periods, to measure and store the minimum and maximum values attained by said data signal.

8. Apparatus as specified in claim 4,
   wherein said producing and holding means include first and second measure and hold channels, and
   wherein said first means additionally include control means operative in synchronism with said sweeping of said ramp signal value and connected to supply control signals to said channels to cause said first channel, during alternate ones of said periods, to produce and hold first and second signals of respective values which represent the respective minimum and maximum values attained by said data signal during said alternate periods, to cause said second channel, during the intervening ones of said periods, to produce and hold first and second signals of respective values which represent the respective minimum and maximum values attained by said data signal during said intervening periods, and to cause said second channel, during said alternate periods, and said first channel, during said intervening periods, to apply its said first and second signals of the immediately previous one of said periods to said comparing means as said output signals, and thereafter to reset the values of its said first and second signals to a datum value, thereby to cause the positions of said two points terminating each of said line segments to represent, respectively, the minimum value and the maximum value of said data signal determined during the immediately previous one of said periods.

9. Apparatus as specified in claim 8, wherein said second means further include display medium marking means including a cathode ray tube having a normally blanked cathode ray beam, wherein said circuit means further include activating means for unblanking said beam only for the time period during each of said sweeps in which the value of said ramp signal lies between the minimum and maximum values had by said data signal during said immediately previous one of said periods, and wherein said second means further include scanning means for effectively sweeping said beam along a path across said display medium in synchronism with said sweeping of the value of said ramp signal, said beam marking said medium only when unblanked.

10. Apparatus as specified in claim 9, wherein said display medium is a record medium, wherein said beam produces a recorded line on said medium when unblanked and swept across said medium, and wherein said second means further include means for moving said medium relative to said tube in a direction which is, for all practical purposes, at right angles to the sweep path of said beam.

11. Apparatus as specified in claim 4, wherein said producing and holding means include first and second peak and valley detectors, and wherein said first means additionally include control means operative in synchronism with said sweeping of said ramp signal value and connected in controlling relation to said detectors to cause said data signal to be effectively applied first to said first detector and then to said second detector alternately, causing one of said detectors always to be determining the minimum and the maximum values of said data signal and producing a first signal having a value representative of said minimum data signal value and a second signal having a value representative of said maximum data signal value, said control means also causing said first and second signals of first said second detector and then said first detector, alternately, to be applied to said comparing means as said two output signals, and thereafter to be reset to a datum value, thereby to cause the positions of said two points terminating each of said line segments to represent, respectively, the minimum value and the maximum value of said data signal determined during the immediately previous one of said periods.

12. Apparatus for applying to a utilization device signals having values representing the minimum and the maximum excursions of the value of a data signal during each of consecutive ones of a series of periods, comprising switching means having alternate first and second states, means connected to said switching means to cause it to assume said first and second states alternately throughout respective consecutive ones of said periods, first and second measure and hold channels, each having an input arranged for connection to a source of a data signal and an output arranged for connection to a utilization device, means connecting said switching means to said channels to cause said first channel, when said switching means has said first state, and said second channel, when said switching means has said second state, to produce and hold first and second signals of respective values which represent the respective minimum and maximum values attained by said data signal during the corresponding ones of said periods, and concurrently to cause said second channel, when said switching means has said first state, and said first channel, when said switching means has said second state, to present in the corresponding one of said outputs said first and second signals of that channel from the immediately preceeding one of said periods, and thereafter to reset the values of the so-presented first and second signals to a datum value.

13. Apparatus as specified in claim 12, wherein said switching means is a flip-flop.

14. Apparatus as specified in claim 13, wherein each of said channels includes a peak and valley detector having an input, a minimum output, and a maximum output, an input analog gate connected between said channel input and said detector input, and an output analog gate connected between said detector outputs and said channel output.

* * * * *